United States Patent
Parkin

(10) Patent No.: US 7,300,711 B2
(45) Date of Patent: Nov. 27, 2007

(54) MAGNETIC TUNNEL JUNCTIONS WITH HIGH TUNNELING MAGNETORESISTANCE USING NON-BCC MAGNETIC MATERIALS

(75) Inventor: Stuart Stephen P. Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 10/904,243

(22) Filed: Oct. 29, 2004

(65) Prior Publication Data

US 2006/0093862 A1    May 4, 2006

(51) Int. Cl.
  G11B 5/39   (2006.01)
  G11B 5/127  (2006.01)
  B05D 3/00   (2006.01)

(52) U.S. Cl. ............... 428/811.1; 428/811.5; 428/812; 428/813; 360/324.2; 427/130; 427/131

(58) Field of Classification Search ............... None
See application file for complete search history.

(56) References Cited

U.S. PATENT DOCUMENTS

| | | | |
|---|---|---|---|
| 5,390,061 A | | 2/1995 | Nakatani et al. |
| 5,465,185 A | | 11/1995 | Heim et al. |
| 5,640,343 A | | 6/1997 | Gallagher et al. |
| 5,650,958 A | | 7/1997 | Gallagher et al. |
| 5,729,410 A | | 3/1998 | Fontana, Jr. et al. |
| 5,764,567 A | | 6/1998 | Parkin |
| 5,841,692 A | | 11/1998 | Gallagher et al. |
| 5,862,022 A | | 1/1999 | Noguchi et al. |
| 5,995,338 A | * | 11/1999 | Watanabe et al. ...... 360/324.12 |
| 6,165,607 A | | 12/2000 | Yamanobe et al. |
| 6,166,948 A | | 12/2000 | Parkin et al. |
| 6,172,859 B1 | | 1/2001 | Watanabe et al. |
| 6,249,407 B1 | | 6/2001 | Aoshima et al. |
| 6,338,899 B1 | | 1/2002 | Fukuzawa et al. |
| 6,365,286 B1 | | 4/2002 | Inomata et al. |
| 6,392,281 B1 | | 5/2002 | Tsuge |

(Continued)

FOREIGN PATENT DOCUMENTS

WO     02/075344 A2    9/2002

(Continued)

OTHER PUBLICATIONS

Magnetic Properties of Co-Fe-Ni films (Jen, S., Chiang, H., Chung, C., Kao, M., J. Mag. Mag. Mat., 236, 2001, 312-319).*

(Continued)

*Primary Examiner*—Kevin M. Bernatz
(74) *Attorney, Agent, or Firm*—Daniel E. Johnson

(57) ABSTRACT

Magnetic material, which is not normally bcc-structured under ambient conditions, is induced into becoming bcc as a result of its proximity to a suitable templating material, such as a bcc-structured underlayer that is in contact with the magnetic material. The magnetic material, in combination with a tunnel barrier and other elements, forms a magnetic tunneling device, such as a magnetic tunnel junction that may have a tunneling magnetoresistance of 100% or more. Suitable tunnel barriers include MgO and Mg—ZnO, and the magnetic material may be Co. The templating material may include such elements as V, Cr, Nb, Mo, and W, or the tunnel barrier MgO may itself serve as the templating material.

75 Claims, 8 Drawing Sheets

U.S. PATENT DOCUMENTS

| | | | |
|---|---|---|---|
| 6,449,135 | B1 | 9/2002 | Ding et al. |
| 6,518,588 | B1 | 2/2003 | Parkin et al. |
| 6,603,642 | B1 | 8/2003 | Araki et al. |
| 6,667,493 | B2 * | 12/2003 | Ooshima ............... 257/49 |
| 6,674,617 | B2 | 1/2004 | Gill |
| 6,687,099 | B2 | 2/2004 | Nakatani et al. |
| 6,791,792 | B2 | 9/2004 | Takahashi |
| 6,819,532 | B2 | 11/2004 | Kamijo |
| 6,841,395 | B2 | 1/2005 | Linn et al. |
| 6,963,096 | B2 | 11/2005 | Schmidt et al. |
| 7,132,175 | B2 * | 11/2006 | Hasegawa et al. ....... 428/811.2 |
| 7,212,385 | B2 | 5/2007 | Hayakawa |
| 2001/0043448 | A1 | 11/2001 | Iwasaki et al. |
| 2002/0006020 | A1 | 1/2002 | Hasegawa |
| 2002/0015269 | A1 | 2/2002 | Iwasaki et al. |
| 2002/0034094 | A1 | 3/2002 | Saito et al. |
| 2002/0054462 | A1 | 5/2002 | Sun et al. |
| 2002/0076940 | A1 | 6/2002 | Hibino |
| 2002/0085319 | A1 | 7/2002 | Hayakawa |
| 2002/0191354 | A1 | 12/2002 | Yoshikawa et al. |
| 2003/0128483 | A1 | 7/2003 | Kamijo |
| 2003/0157373 | A1 | 8/2003 | Kirino et al. |
| 2003/0161181 | A1 | 8/2003 | Saito et al. |
| 2003/0169542 | A1 | 9/2003 | Gill |
| 2003/0179071 | A1 | 9/2003 | Hiramoto et al. |
| 2003/0197984 | A1 | 10/2003 | Inomata et al. |
| 2003/0227799 | A1 | 12/2003 | Higo et al. |
| 2004/0023075 | A1 | 2/2004 | Saito et al. |
| 2004/0058196 | A1 * | 3/2004 | Lambeth ............... 428/694 BH |
| 2004/0144995 | A1 | 7/2004 | Nagahama et al. |
| 2004/0207961 | A1 | 10/2004 | Ichimura et al. |
| 2004/0234815 | A1 | 11/2004 | Drewes |
| 2005/0074634 | A1 * | 4/2005 | Hasegawa et al. ....... 428/694 T |
| 2005/0094327 | A1 | 5/2005 | Okuno et al. |
| 2005/0152077 | A1 | 7/2005 | Yuasa et al. |
| 2005/0238924 | A1 * | 10/2005 | Gill ............................ 428/837 |
| 2006/0164759 | A1 | 7/2006 | Okada et al. |
| 2007/0154740 | A1 | 7/2007 | Yuasa et al. |

FOREIGN PATENT DOCUMENTS

WO      02/099905 A1    12/2002

OTHER PUBLICATIONS

X-F. Han et al., "Fabrication of high-magnetoresistance tunnel junctions using Co75Fe25 ferromagnetic electrodes", Applied Physics Letters, vol. 77, No. 2, Jul. 10, 2000, pp. 283-285.

S. Yuasa et al., "High Tunnel Magnetoresistance at Room Temperature in Fully Epitaxial Fe/MgO/Fe Tunnel Junctions due to Coherent Spin-Polarized Tunneling", Japanese Journal of Applied Physics, vol. 43, No. 4B, 2004, pp. L588-L590.

W. H. Butler et al., "Spin-dependent tunneling conductance of Fe/MgO/Fe sandwiches", Physical Review B, vol. 63, 2001, pp. 054416-1 through 054416-12.

M. Tsunoda et al., "60% magnetoresistance at room temperature in Co-Fe/Al-O/Co-Fe tunnel junctions oxidized with Kr-O2 plasma", Applied Physics Letters, vol. 80, No. 17, Apr. 29, 2002, pp. 3135-3137.

J. S. Moodera et al., "Large Magnetoresistance at Room Temperature in Ferromagnetic Thin Film Tunnel Junctions", Physical Review Letters, vol. 74, No. 16, Apr. 17, 1995, pp. 3273-3276.

S. S. P. Parkin et al., "Exchange-biased magnetic tunnel junctions and application to nonvolatile magnetic random access memory (invited)", Journal of Appl. Physics, vol. 85, No. 8, Apr. 15, 1999, pp. 5828-5833.

T. Miyazaki et al., "Giant magnetic tunneling effect in Fe/Al2O3/Fe junction", Journal of Magnetism and Magnetic Materials, vol. 139, 1995, pp. L231-L234.

M. Julliere, "Tunneling Between Ferromagnetic Films", Physics Letters, vol. 54A, No. 3, Sep. 8, 1975, pp. 225-226.

S. S. P. Parkin et al., "Oscillations in Exchange Coupling and Magnetoresistance in Metallic Superlattice Structures: Co/Ru, Co/Cr, and Fe/Cr", Physical Review Letters, vol. 64, No. 19, May 7, 1990, pp. 2304-2307.

S. S. P. Parkin, "Systematic Variation of the Strength and Oscillation Period of Indirect Magnetic Exchange Coupling through the 3d, 4d, and 5d Transition Metals", Physical Review Letters, vol. 67, No. 25, Dec. 16, 1991, pp. 3598-3601.

D. C. Worledge et al., "Magnetoresistance measurement of unpatterned magnetic tunnel junction wafers by current-in-plane tunneling", Applied Physics Letters, vol. 83, No. 1, Jul. 7, 2003, pp. 84-86.

D. Wang et al., "70% TMR at Room Temperature for SDT Sandwich Junctions With CoFeB as Free and Reference Layers", IEEE Trans. on Magnetics, vol. 40, No. 4, Jul. 2004, pp. 2269-2271.

C. M. Boubeta et al., "Epitaxial Fe/MgO heterostructures on GaAs (001)", Journal of Crystal Growth, vol. 226, 2001, pp. 223-230.

R. Meservey et al., "Spin-Polarized Electron Tunneling", Physics Reports (Review Section of Physics Letters) vol. 238, No. 4 (1994) pp. 173-243.

S. Yuasa et al., "High Tunnel Magnetoresistance at Room Temperature in Fully Epitaxial Fe/MgO/Fe Tunnel Junctions due to Coherent Spin-Polarized Tunneling", Japanese Journal of Applied Physics, Apr. 2, 2004, p. L588, vol. 43, No. 4B, Japan.

* cited by examiner

MAGNETIC TUNNEL JUNCTIONS WITH HIGH TUNNELING MAGNETORESISTANCE USING NON-BCC MAGNETIC MATERIALS

The U.S. Government has a paid-up license in this invention and the right in limited circumstances to require the patent owner to license others on reasonable terms as provided for by the terms of contract MDA972-99-C-0009 awarded by DARPA.

TECHNICAL FIELD

The invention relates to magnetic tunnel junction (MTJ) magnetoresistive (MR) devices for use as magnetic field sensors such as read heads for reading magnetically recorded data, as memory cells in nonvolatile magnetic random access memory (MRAM) cells, and for magnetic logic and spintronic applications. More particularly, this invention relates to an improved MTJ exhibiting high tunneling magnetoresistance with one or more electrodes formed from ferromagnetic and ferrimagnetic materials whose structure is stabilized in a body centered cubic (bcc) structure by templating with a suitable material.

BACKGROUND OF THE INVENTION

The basic component of a magnetic tunnel junction is a sandwich of two thin ferromagnetic and/or ferrimagnetic layers separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ is the reference layer and has its magnetic moment fixed or pinned, so that its magnetic moment is unaffected by the presence of the magnetic fields applied to the device during its operation. The other ferromagnetic layer in the sandwich is the storage layer, whose moment responds to magnetic fields applied during operation of the device. In the quiescent state, in the absence of any applied magnetic field within the memory cell, the storage layer magnetic moment is designed to be either parallel (P) or anti-parallel (AP) to the magnetic moment of the reference ferromagnetic layer. For a TMR field sensor for read head applications, the reference ferromagnetic layer has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

FIG. 1A illustrates a cross-section of a conventional prior-art MTJ device. The MTJ 100 includes a bottom "fixed" or "reference" ferromagnetic (F) layer 15, an insulating tunnel barrier layer 24, and a top "free" or "storage" ferromagnetic layer 34. The MTJ 100 has bottom and top electrical leads 12 and 36, respectively, with the bottom lead being formed on a suitable substrate 11, such as a silicon oxide layer. The ferromagnetic layer 15 is called the fixed (or reference) layer because its magnetic moment is prevented from rotating in the presence of an applied magnetic field in the desired range of interest for the MTJ device, e.g., the magnetic field caused by the write current applied to the memory cell from the read/write circuitry of the MRAM. The magnetic moment of the ferromagnetic layer 15, whose direction is indicated by the arrow 90 in FIG. 1A, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest. In the absence of an applied magnetic field, the moments of the ferromagnetic layers 15 and 34 are aligned generally parallel (or anti-parallel) in an MTJ memory cell (as indicated by the double-headed arrow 80 in FIG. 1A) and generally perpendicular in a MTJ magnetoresistive read head. The relative orientation of the magnetic moments of the ferromagnetic layers 15, 34 affects the tunneling current and thus the electrical resistance of the MTJ device. The bottom lead 12, the antiferromagnetic layer 16, and the fixed ferromagnetic layer 15 together may be regarded as constituting the lower electrode 10.

The basic concept of a magnetic tunnel junction was first realized in 1975 (M. Julliére, "*Tunneling between ferromagnetic films*", Phys. Lett. 54A, 225 (1975)), although the TMR was very small and observed only at low temperatures and for very small bias voltages. In 1995 significant TMR effects of about 10% were obtained at room temperature in MTJs with $Al_2O_3$ tunnel barriers by two different groups (J. S. Moodera et al., "*Large magnetoresistance at room temperature in ferromagnetic thin film tunnel junctions*", Phys. Rev. Lett. 74, 3273 (1995); and T. Miyazaki and N. Tezuka, "*Giant magnetic tunneling effect in $Fe/Al_2O_3/Fe$ junction*", J. Magn. Magn. Mat. 139, L231 (1995)). Subsequently, S. S. P. Parkin et al. ("*Exchange-biased Magnetic Tunnel Junctions and Application to Non-Volatile Magnetic Random Access Memory*", J. Appl. Phys. 85, 5828 (1999)) obtained effects as large as about 48-50% by optimizing the growth of the $Al_2O_3$ tunnel barrier, by optimizing the interface between the $Al_2O_3$ tunnel barrier and the ferromagnetic electrodes, and by carefully controlling the magnetic orientation of the ferromagnetic moments using concepts of magnetic engineering, in particular, exchange bias (see U.S. Pat. No. 5,650,958 titled "*Magnetic tunnel junctions with controlled magnetic response*" to W. J. Gallagher et al.) and an anti-parallel coupled pinned ferromagnetic layer (see U.S. Pat. No. 5,841,692 titled "*Magnetic tunnel junction device with antiferromagnetically coupled pinned layer*" to W. J. Gallagher et al.).

The magnetoresistance of MTJs using aluminum oxide tunneling barriers is limited to about 50% at room temperature (S. S. P. Parkin et al., "*Exchange-biased Magnetic Tunnel Junctions and Application to Non-Volatile Magnetic Random Access Memory*", J. Appl. Phys. 85, 5828 (1999); X.-F. Han et al., "*Fabrication of high-magnetoresistance tunnel junctions using $Co_{75}Fe_{25}$ ferromagnetic electrodes*", Appl. Phys. Lett. 77, 283 (2000)), although there have been reports of TMR values of up to 70% at room temperature using CoFeB ferromagnetic electrodes (Tsunekawa et al., "*Over 70% TMR at Room Temperature in MTJ films with various SAF configurations*", MMM-Intermag conference, Anaheim (2004) and Wang et al., "*70% TMR at room*

*temperature for SDT sandwich junctions with CoFeB as free and reference layers*", IEEE Trans. Magn. 40, 2269 (2004)).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the variation in resistance of the MTJs from device to device which can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device. The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

U.S. patent application Ser. No. 10/824,835 to Parkin titled "MgO tunnel barriers and method of formation" (filed Apr. 14, 2004), which is hereby incorporated by reference, discloses a method of forming a tunnel barrier comprised of magnesium oxide (MgO) with which magnetic tunnel junctions can be deposited which exhibit tunneling magnetoresistance values of more than 100% at low bias. The tunnel barrier is formed by first depositing a thin layer of Mg using, for example, magnetron or ion beam sputter deposition followed by a layer of Mg deposited in the presence of oxygen. In addition, Parkin discloses methods of forming highly oriented crystalline MgO tunnel barriers by forming the MgO barrier on a ferromagnetic electrode comprised of a Co—Fe alloy, which is bcc and (100) textured. The CoFe electrode is formed on a (100) oriented antiferromagnetic layer of fcc IrMn which itself is grown highly oriented by forming this layer on suitable underlayers, for example, a combination of a TaN layer followed by a Ta layer.

Useful MTJ devices for magnetic recording read heads or for MRAM memory cells will be of sub-micron dimensions. This leads to very large self-demagnetizing for devices which are not circular in cross-section and very large magnetostatic coupling fields between ferromagnetic layers in the same device. For example, in the conventional device shown in FIG. 1A, there will be a very large interaction between the pinned ferromagnetic layer 15 and the free or storage ferromagnetic layer 34 because of magnetic poles formed at the edges of the device 100. These coupling fields are so large as to make such devices typically unworkable because the direction of the magnetic moment of the storage layer 34, indicated by the arrow 80 in FIG. 1A, will preferentially be oriented antiparallel to that of the direction of the magnetic moment of the fixed ferromagnetic layer 15, indicated by the arrow 90 in FIG. 1A. One method to solve this problem was first proposed by Parkin and Heim with reference to metallic spin-valve giant magnetoresistance sensors in IBM's U.S. Pat. No. 5,465,185, wherein the reference ferromagnetic layer 15 is replaced by a sandwich of two ferromagnetic layers 18 and 19 antiferromagnetically coupled through a metallic spacer layer 17 as shown by the MTJ 100' of FIG. 1B. The lower electrode is now given by the reference numeral 10', and the magnetic orientation of the layers 18 and 19 is given by the arrows 90' and 95, respectively. Parkin showed that the spacer layer can be comprised of a wide variety of non-magnetic metals chosen from the groups of the 3d, 4d, and 5d transition metals as well as the noble metals, Cu, Au and Ag such that the layers 18 and 19 are indirectly exchange coupled through the metallic spacer layer 17 (S. S. P. Parkin et al. "*Oscillations in Exchange Coupling and Magnetoresistance in Metallic Superlattice Structures: Co/Ru, Co/Cr and Fe/Cr*", Phys. Rev. Lett. 64, 2304 (1990) and S. S. P. Parkin, "*Systematic Variation of Strength and Oscillation Period of Indirect Magnetic Exchange Coupling through the 3d, 4d and 5d Transition Metals*", Phys. Rev. Lett. 67, 3598 (1991)). For certain thicknesses of the spacer layer 17, the magnetic moments of the ferromagnetic layers 18 and 19 are antiferromagnetically coupled to one another so that the net magnetic moment of the sandwich can be chosen to be arbitrarily small. Consequently, the demagnetization field from the edges of the layer 18 is reduced by the opposite demagnetizing field arising from the poles at the edges of the layer 19. The net demagnetizing field can be zero by proper choice of the thicknesses and the magnetic material forming layers 18 and 19. In particular Parkin (S. S. P. Parkin et al. "*Oscillations in Exchange Coupling and Magnetoresistance in Metallic Superlattice Structures. Co/Ru, Co/Cr and Fe/Cr*", Phys. Rev. Lett. 64, 2304 (1990)) showed that Ru is a highly preferred antiferromagnetic coupling layer because of the large antiferromagnetic (AF) coupling strength exhibited by very thin layers of Ru and because Ru displays large AF coupling for a wide range of ferromagnetic materials. Moreover, structures using Ru antiferromagnetic coupling layers also display high thermal stability. For these reasons the synthetic antiferromagnetic structure formed from the combination of ferromagnetic layers 18 and 19 separated by a thin Ru layer 17 has become the de facto structure of choice for magnetic recording read heads based on giant magnetoresistance as well as for magnetic tunnel junction memory cells based on spin dependent tunneling using amorphous alumina tunnel barriers. The use of synthetic antiferromagnetic reference layers using Ru antiferromagnetic coupling layers for MTJ sensor and memory applications is described in IBM's U.S. Pat. No. 5,841,692 titled "*Magnetic tunnel junction device with antiferromagnetically coupled pinned layer*" to W. J. Gallagher et al.

It is generally desirable for the ferromagnetic electrodes to be comprised of low magnetization ferromagnetic materials so as to reduce the demagnetization fields from the ferromagnetic electrodes (with or without the use of the synthetic antiferromagnetic structure). A reference layer can be comprised of a single ferromagnetic layer if this layer can be made sufficiently thin so as to have a low enough magnetic moment and corresponding demagnetizing field. Usually, there will be some sort of ferromagnetic coupling of the reference and free layer due to Neel coupling typically associated with correlated roughness of the surfaces of the reference and free layer on either side of the tunneling barrier. This Neel coupling can be balanced by the demagnetizing field to allow for control of the coupling field between the reference and free layers.

In a cross-point MRAM the MTJ devices are switched by the application of two magnetic fields applied along two orthogonal directions, the easy and hard axes of the MTJ device. Typically the magnetic easy and hard anisotropy axes are defined by the shape of the MTJ element through the self demagnetizing fields although the magnetic materials themselves may give rise to an additional uniaxial anisotropy field. The MRAM array will contain a series of MTJ elements arranged along a series of word and bit lines, typically arranged orthogonal to one another. The magnetic switching fields are realized by passing currents along the word and bit lines. All the cells along a particular word or bit line will be subject to the same word or bit line field. Thus the width of the distribution of switching fields for the selected MTJs (those subject to the vector sum of the bit and word line fields) must be sufficiently narrow that it does not overlap the distribution of switching fields for the half-selected devices. The moment within the MTJ devices lies along a particular direction, the easy axis. The orthogonal direction is the magnetic "hard" axis. It is important that the demagnetizing fields from neighboring elements be minimized so that they do not increase the width of the distribution of writing fields. Thus the use of low moment ferromagnetic materials is important in this regard.

It is in general desirable for the MTJ to exhibit the largest possible tunneling magnetoresistance, so as to allow for unavoidable cell-to-cell variations in resistance of the MTJ devices within an MRAM array of cells. The methods of forming MTJs with high tunneling magnetoresistance values described in U.S. patent application Ser. No. 10/824,835 to Parkin titled "MgO tunnel barriers and method of formation" (filed Apr. 14, 2004) requires that the MgO tunnel barrier be simple cubic and preferably (100) textured and surrounded on both sides by ferromagnetic layers which are bcc and preferably (100) textured. The preferred materials described in this prior application include alloys of Co and Fe which are bcc.

What is needed is a method of forming MTJs with high tunneling magnetoresistance and ferromagnetic electrodes formed from low moment ferromagnetic materials for improved writing performance.

SUMMARY OF THE INVENTION

One preferred aspect of the invention is a method that includes depositing magnetic material onto a bcc-structured underlayer to induce the magnetic material to form a bcc-structured magnetic layer, in which the magnetic material by itself does not form a thermodynamically stable bcc-structure at room temperature and a pressure less than 1 atmosphere (for example, under typical deposition conditions). The magnetic material includes a ferromagnetic material and/or a ferrimagnetic material. The method further includes forming a tunnel barrier over the deposited magnetic material to permit spin-polarized current to pass between the tunnel barrier and the magnetic material, and the tunnel barrier may advantageously be either MgO or Mg—ZnO. In preferred methods, the deposited magnetic material is at least partially (100) oriented to improve the performance of the tunnel barrier, and the tunnel barrier itself is (100) oriented. The bcc-structured underlayer may be neither ferromagnetic nor ferrimagnetic, and may include at least one of V, Cr, Nb, Mo, and W, which may be alloyed with at least one of Fe, Co, and Ni, e.g., a CoFe alloy having an Fe content of at least 14 atomic percent. Furthermore, the bcc-structured underlayer may include a layer of non-ferromagnetic, non-ferrimagnetic material over a layer of magnetic material selected from the group consisting of ferromagnetic materials and ferrimagnetic materials. The deposited magnetic material, on the other hand, is preferably Co or includes material selected from the group consisting of CoNi and NiFe alloys, and preferably has a thickness of between about 0.5 and about 1.5 nm; it may be selected because it has a desirable physical parameter related to, for example, corrosion resistance, magnetic anisotropy, and/or magnetorestriction. Annealing is preferably used to improve device performance, e.g., at a temperature of at least 220° C. A layer of magnetic material may be deposited over the tunnel barrier to form a magnetic tunnel junction, which may have a tunneling magnetoresistance of at least 80% or even 100%.

A preferred embodiment of the invention is a device that includes a tunnel barrier such as MgO or Mg—ZnO, a bcc structure, and a magnetic layer (that includes material selected from the group consisting of ferromagnetic materials and ferrimagnetic materials) located between the tunnel barrier and the bcc structure. The magnetic layer by itself does not form a thermodynamically stable bcc-structure at room temperature and a pressure less than 1 atmosphere (for example, under typical deposition conditions), but it is nevertheless bcc-structured because of its proximity to the bcc structure, and its proximity with the tunnel barrier permits spin-polarized current to pass between the tunnel barrier and the magnetic layer. The magnetic material is preferably at least partially (100) oriented to improve the performance of the tunnel barrier, and the tunnel barrier is preferably (100) oriented. The magnetic layer is preferably Co or a material such as a CoNi or NiFe alloy, and it preferably has a thickness of between about 0.5 and about 1.5 nm. The device may further comprise a second layer of magnetic material in proximity with the tunnel barrier, so that the device forms a magnetic tunnel junction; the magnetic tunnel junction may advantageously have a tunneling magnetoresistance of 80% or even 100%.

Another preferred embodiment of the invention is a device that includes a bcc magnetic material (e.g., a ferromagnetic material or a ferrimagnetic material) and a tunnel barrier in proximity with the bcc magnetic material, thereby permitting spin-polarized current to pass between the tunnel barrier and the magnetic layer. The bcc magnetic material by itself does not form a thermodynamically stable bcc-structure at room temperature and a pressure less than 1 atmosphere, but it is nevertheless bcc because of its proximity to a nearby material having a structure that induces the magnetic material to form a bcc-structure. The tunnel barrier may advantageously be MgO, Mg—Zn oxide, or ZnS, ZnSe, ZnTe, CdS, CdSe, CdTe, AlAs and $Al_{1-x}Ga_xAs$. The magnetic material preferably includes Co or a material selected from the group consisting of CoNi and NiFe alloys. The nearby material may advantageously include at least one of V, Cr, Nb, Mo, W, and alloys thereof, or one or more of these elements may be alloyed with at least one of Fe and Co. In one preferred embodiment, the nearby material is MgO of a simple cubic structure, and the MgO may be in direct contact with the bcc magnetic material. The bcc magnetic material is preferably at least partially (100) oriented to improve the performance of the tunnel barrier, and the tunnel barrier is preferably (100) oriented. The device may also include a layer of magnetic material that together with the bcc magnetic material and the tunnel barrier forms a magnetic tunnel junction. The magnetic tunnel junction may have a tunneling magnetoresistance of at least 80% or even at least 100%.

Another preferred aspect of the invention is a method that includes positioning preselected magnetic material and a tunnel barrier in proximity with each other, to form a structure that permits spin-polarized current to pass between the tunnel barrier and bcc magnetic material. The preselected magnetic material, which includes ferromagnetic material and/or ferrimagnetic material, does not by itself form a thermodynamically stable bcc-structure at room temperature and a pressure less than 1 atmosphere, but it is nevertheless bcc-structured because of its proximity to a nearby material having a structure that induces it to form said bcc magnetic material. The nearby material may be the tunnel barrier, such as simple cubic MgO. The preselected magnetic material is advantageously selected because it has a desirable physical parameter related to corrosion resistance, magnetic anisotropy, and/or magnetorestriction. For example, the preselected magnetic material may include Co, or material such as a CoNi or NiFe alloy. The nearby material may advantageously include at least one of V, Cr, Nb, Mo, and W, which may be alloyed with at least one of Fe and Co. The bcc magnetic material is preferably at least partially (100) oriented to improve the performance of the tunnel barrier, and the tunnel barrier is (100) oriented. The method may further include forming a magnetic layer in proximity with the tunnel barrier, so that the magnetic layer, the preselected magnetic material, and the tunnel barrier form a magnetic tunnel junction. The magnetic tunnel junction is preferably annealed at a temperature of at least 220° C. to improve its tunneling magnetoresistance, e.g., so that its tunneling magnetoresistance is at least 80% or even at least 100%.

In preferred implementations of the methods herein, the tunnel barrier includes MgO, and the MgO tunnel barrier is formed by depositing Mg onto a surface of an underlayer to form a Mg layer thereon (in which the surface is selected to be substantially free of oxide) and directing additional Mg, in the presence of oxygen, towards the Mg layer to form a MgO tunnel barrier in contact with the underlayer, with the oxygen reacting with the additional Mg and the Mg layer.

In other preferred implementations of the methods herein, the tunnel barrier includes Mg—ZnO, and the Mg—ZnO tunnel barrier is formed by depositing a metal layer onto a surface of an underlayer (in which the surface is selected to be substantially free of oxide) and directing additional metal towards the metal layer, in the presence of oxygen, to form a magnesium-zinc oxide tunnel barrier in contact with the underlayer, with the oxygen reacting with the additional metal and the metal layer. At least one of the metal layer and the additional metal includes Zn, and at least one of the metal layer and the additional metal includes Mg.

The MgO and Mg—ZnO tunnel barriers of the magnetic tunnel junction devices disclosed herein are preferably prepared according to methods in which the lower ferromagnetic (or ferrimagnetic) electrode is not oxidized, so as to give much higher tunnel magnetoresistance values than in the prior art. Similarly, much higher spin polarization values of tunneling current are obtained in tunnel junction devices with one or more ferromagnetic (or ferrimagnetic) electrodes. The MgO or Mg—ZnO tunnel barrier so formed does not have a significant number of defects that would otherwise lead to hopping conductivity through the tunnel barrier. In preferred methods, highly oriented (100) MgO or Mg—ZnO barriers are formed without using single crystalline substrates or high deposition temperatures, thereby facilitating the manufacture of devices using standard deposition techniques on polycrystalline or amorphous films. Post anneal treatments are preferred to improve the tunneling magnetoresistance, which for the MgO structures disclosed herein can exceed 80 or even 100% at room temperature.

For several aspects and embodiments of the invention disclosed herein, a MgO or Mg—ZnO tunnel barrier is sandwiched between an underlayer and an overlayer, either one or both of which may include one or more layers of a ferromagnetic material, a ferrimagnetic material, and/or a semiconductor. While the MgO (or Mg—ZnO) tunnel barrier is preferably in direct contact with the ferromagnetic material, ferrimagnetic material and/or semiconductor, each of the underlayer and overlayer may optionally include one or more spacer layers which are adjacent to the tunnel barrier but which do not significantly affect the tunneling properties of the MgO (or Mg—ZnO) layer, e.g., by not significantly diminishing the spin polarization of electrons tunneling through the tunnel barrier. (It should be understood that the terms underlayer and overlayer do not necessarily imply any particular orientation with respect to gravity.)

Performance of the MgO (or Mg—ZnO) tunnel barriers disclosed herein may be improved through annealing, wherein performance refers to various attributes of the tunnel barrier or associated device. For example, annealing a magnetic tunnel junction improves, in particular, its magneto-tunneling resistance; annealing a tunnel barrier improves, in particular, its spin polarization. In particular by annealing these tunnel barriers, tunneling magneto-resistance of more than 100% can readily be achieved using methods of thin film deposition and substrate materials compatible with conventional manufacturing technologies. Annealing temperatures may be in the range from 200° C. to 400° C. The same anneal that improves the tunneling magnetoresistance may also be used to set the direction of an optional exchange bias field provided by an antiferromagnetic exchange bias layer.

The preferred embodiments and implementations herein are directed to structures in which the magnetic material has a body-centered cubic (bcc) lattice, since this lattice type leads to the best performance of the MgO or Mg—ZnO tunnel barrier (e.g., the highest TMR for a tunnel junction). It should be noted, however, that in thin films, because of strain induced by overlayers and/or underlayers, the in-plane and out-of-plane lattice constants may be slightly different, and the lattice may be slightly distorted from the pure bcc case, e.g., as a result of a tetragonal distortion. As used herein, the term "body centered cubic" (bcc) should be construed broadly enough to encompass such deviations from the pure bcc case.

The preferred embodiments and implementations of the invention are directed to magnetic layers and MgO or Mg—ZnO tunnel barrier layers which are substantially (100) oriented or textured. Certain magnetic layers and tunnel barrier layers are polycrystalline and are comprised of grains or crystallites which range in lateral extent from approximately one hundred to several hundred angstroms (e.g., 500 angstroms). Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer, but the (100) direction within individual grains may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques.

There may also be present grains which are oriented in a completely different direction, but the proportion of these grains is small for the method of formation of the magnetic tunnel junction structures described herein. Note that the crystalline grains are randomly oriented with respect to a direction within the plane of the substrate on which the film structures are grown. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

Notwithstanding the polycrystalline nature of the film structures described herein, which are in any case preferable for ease of manufacturing, the method of forming the MgO (or Mg—ZnO) tunnel barrier described herein can also be applied to the growth of epitaxial single crystalline film structures, wherein the structures are prepared on a face of a single crystalline substrate chosen so that the crystalline spacing and crystalline cell is compatible with the growth of a bcc ferromagnetic metal layer oriented in the (100) growth direction and the subsequent growth of a MgO (or Mg—ZnO) tunnel barrier according one of the preferred embodiments described herein.

For a fuller understanding of the nature and advantages of the present invention, reference should be made to the following detailed description taken together with the accompanying figures.

BRIEF DESCRIPTION OF THE DRAWINGS

FIG. 1, which includes FIG. 1A shows a magnetic tunnel junction with a reference and a storage ferromagnetic layer, and FIG. 1B shows a magnetic tunnel junction device with a reference layer (formed from a synthetic antiferromagnet) and a storage ferromagnetic layer.

FIGS. 4A and 4B, shows the dependence of tunneling magnetoresistance on the applied magnetic field in the plane of a magnetic tunnel junction device for the structure shown in FIG. 3A for the various indicated thicknesses of a bcc-structured Co magnetic layer, which forms part of the reference electrode. FIG. 4A shows a sequence of major loops and FIG. 4B shows a sequence of minor loops at room temperature after an anneal treatment.

FIGS. 5A and 5B, shows the dependence of the tunneling magnetoresistance (in FIG. 5A) and the resistance-area product (in FIG. 5B) for an MTJ of the present invention that uses a bcc-structured Co magnetic layer as part of the reference and storage electrodes, respectively.

DESCRIPTION OF THE PREFERRED EMBODIMENTS

Figure 1A:
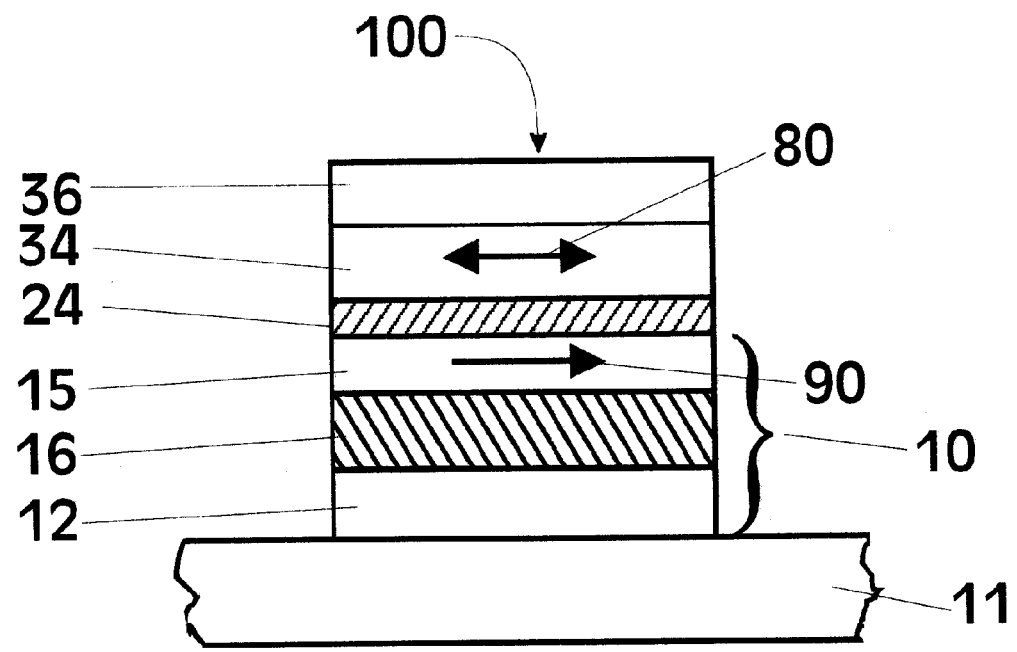
FIGS. 1A and 1B, is a schematic of a magnetic tunnel junction formed in accordance with the prior art.

The tunneling current in an MTJ is spin polarized, which means that the electrical current passing from one of the ferromagnetic layers is predominantly composed of electrons of one spin type (spin up or spin down, depending on the orientation of the magnetization of the ferromagnetic layer). The tunneling spin polarization P of the current can be inferred from a variety of different measurements. The measurement most relevant to magnetic tunneling is to measure the conductance as a function of bias voltage for junctions formed from a sandwich of the ferromagnetic material of interest and a superconducting counter electrode (R. Meservey and P. M. Tedrow, Phys. Rep. 238, 173 (1994)). These studies show that the spin polarization of the tunnel current measured in this way can be simply related to the TMR close to zero bias voltage as first proposed by Julliére (M. Julliére, Phys. Lett. 54A, 225 (1975)). In such a model P is defined as $$(n_\uparrow - n_\downarrow)/(n_\uparrow + n_\downarrow)$$

where $$n_\uparrow$$

and $$n_\downarrow$$

are the density of spin up and spin down states at the ferromagnet/insulator interface. By assuming that the tunnel current is comprised of two independent majority and minority spin currents and that these currents are related to the respective density of states of the majority and minority carriers in the opposing ferromagnetic electrodes, the TMR can be formulated by the relation $$TMR = (R_{AP} - R_P)/R_P = 2P_1 P_2 / (1 - P_1 P_2),$$

where $R_{AP}$ and $R_P$ are the resistances of the MTJ for anti-parallel and parallel orientation of the ferromagnetic electrodes, respectively, and $P_1$ and $P_2$ are the spin polarization values of the two ferromagnetic electrodes. Experimentally, it is clear that the magnitude of the TMR is extremely sensitive to the nature of the interface between the tunneling barrier and the ferromagnetic electrode. By changing the properties of the interface layer, for example, by inserting very thin layers of non-magnetic metals between the ferromagnet and the insulator layers, the TMR can be dramatically altered. Based on such observations, most experimental data on magnetic tunneling have usually been interpreted by assuming that P is largely determined by the electronic structure of the ferromagnetic interface layer essentially independent of the tunnel barrier electronic structure. However, it is now recognized that P can be strongly influenced by the probability of tunneling of electrons which depends not only on their spin but also on the tunneling matrix element. The tunneling matrix element is determined by the detailed electronic structure of the ferromagnetic, the tunnel barrier and that of the interface between the ferromagnetic electrode and the tunnel barrier. For the same ferromagnetic electrode, the polarization of the tunneling current P varies depending on the material and structure of the tunnel barrier.

The possibility of high tunneling magnetoresistance in MTJs formed from Fe/MgO/Fe sandwiches where the tunnel barrier is formed from crystalline (100) oriented MgO layers was theorized by W. H. Butler, X.-G. Zhang, T. C. Schulthess et al., Phys. Rev. B 63, 054416 (2001). The high TMR results from the very slow decay through the tunnel barrier of majority electrons of a particular symmetry for the (100) orientation of Fe/MgO. This also means that the polarization of the tunneling electrons should also be very high. However, extensive experimental work by many groups over a period of several years showed no evidence for improved tunneling magnetoresistance values using crystalline (100) MgO tunnel barriers as compared to amorphous alumina tunnel barriers. It was speculated that during the formation of the MgO tunnel barrier, the surface of the lower Fe electrode became oxidized perhaps resulting in much lower TMR than theorized. In U.S. patent application Ser. No. 10/824,835 to Parkin titled "MgO tunnel barriers and method of formation" (filed Apr. 14, 2004), supra, a method for forming MgO tunnel barriers is described which gives rise to MTJs which exhibit extraordinarily high values of tunneling magnetoresistance. To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an Ar—$O_2$ plasma. Using this method of preparing the MgO barrier, very high tunneling magnetoresistance values were obtained, much higher than any previously reported values for any MTJ at room temperature.

Figure 1B:
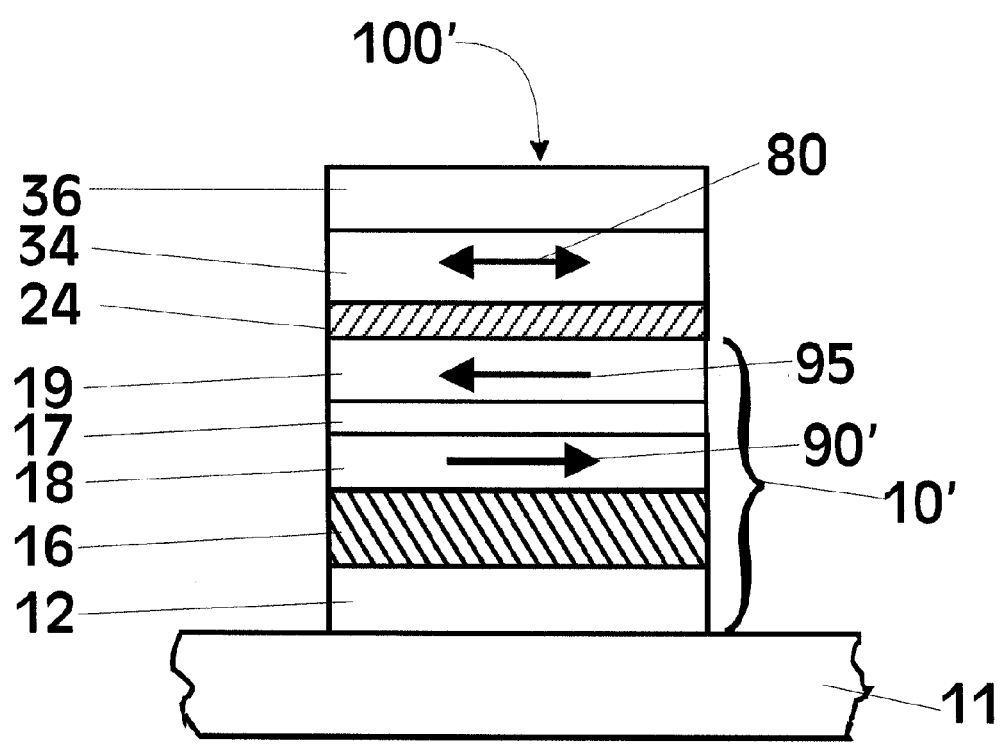
Figure 2A:
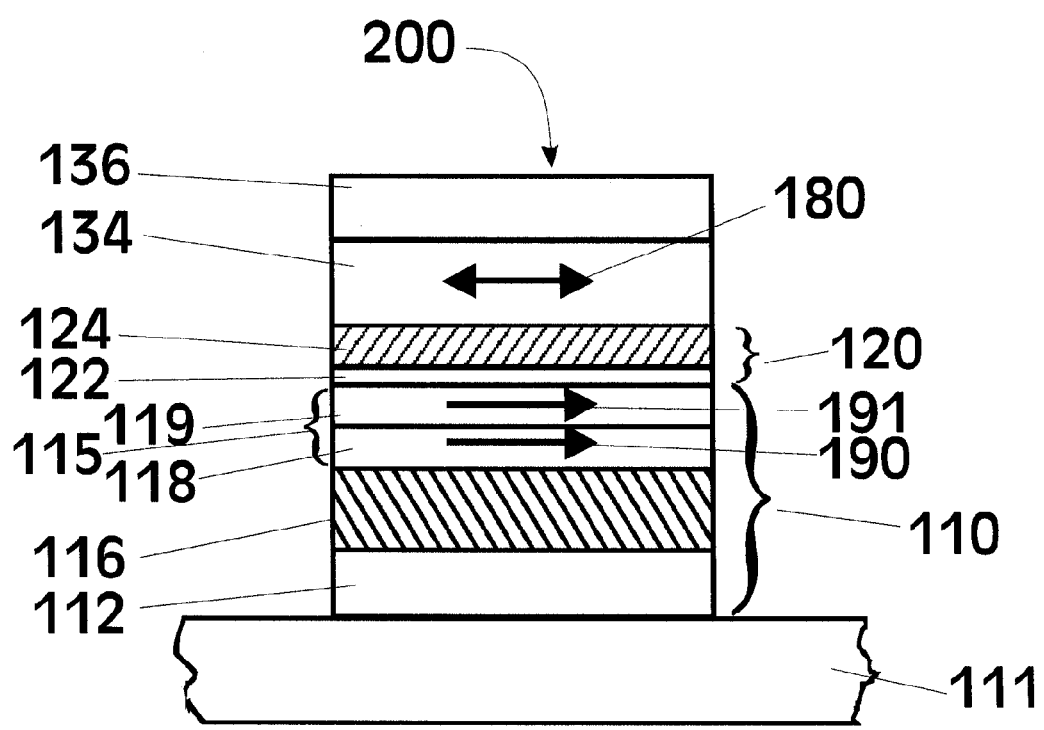
FIG. 2A illustrates the sequence of layers that are deposited to form a magnetic tunnel junction having high tunneling magnetoresistance (TMR).
Figure 2B:
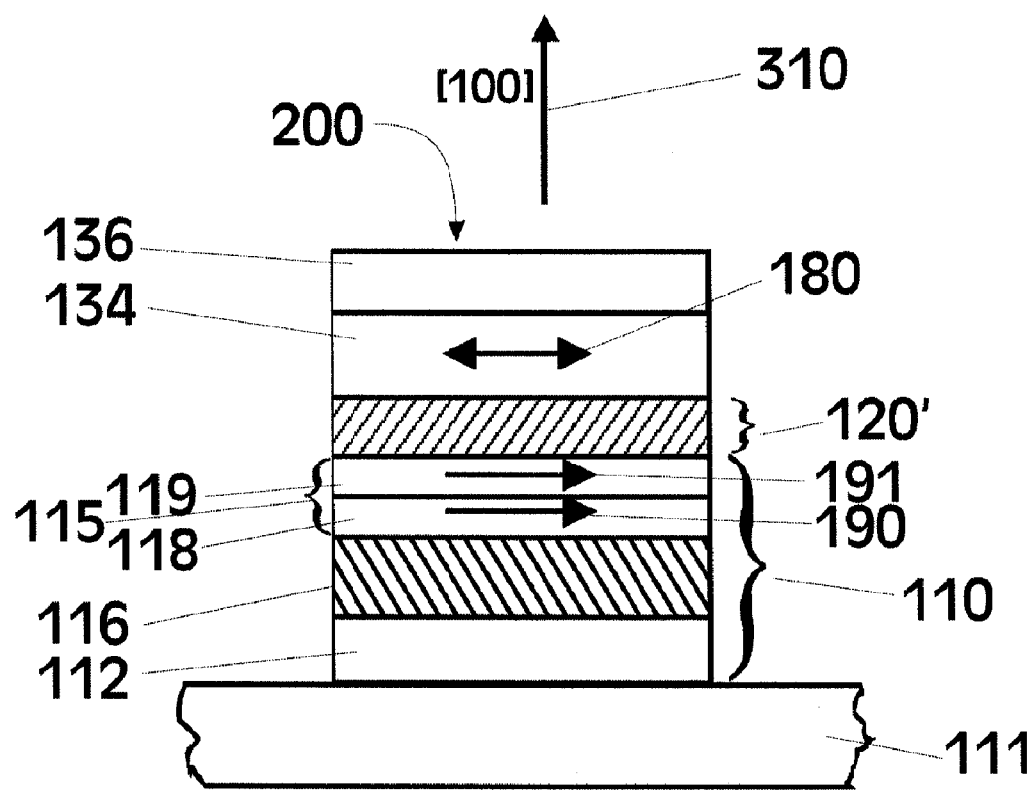
FIG. 2B is a cross sectional view of the magnetic tunnel junction that is formed according to the methodology of FIG. 2A.

FIG. 2A illustrates this process of forming a MTJ 200, in which a tunnel barrier 120 is formed by first depositing a thin Mg layer 122 followed by deposition by reactive sputtering of an MgO layer 124. As shown in FIG. 2B, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. The thickness of the resulting MgO layer 120' is preferably in the range of 3-50 angstroms, more preferably 3-30 angstroms, still more preferably 3-20 angstroms, and most preferably 4-15 angstroms. FIG. 2A shows a device that includes a substrate 111, a bottom electrical lead 112, an antiferromagnetic layer 116, a fixed ferromagnetic (or ferrimagnetic) layer 115, a "free" ferromagnetic (or ferrimagnetic) layer 134, and a top electrical lead 136, all of which are similar to their FIG. 1B counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 115, respectively. As shown in FIGS. 2A and 2B, the fixed ferromagnetic layer 115 may actually be a bilayer of two different ferromagnetic layers 118 and 119, each having a magnetic moment oriented as indicated by the arrows 190 and 191, respectively. The bilayer 115, the antiferromagnetic layer 116, and the bottom lead 112 of FIGS. 2A and 2B constitute a lower electrode 110.

MTJ structures formed according to the method described in U.S. patent application Ser. No. 10/824,835 to Parkin titled "MgO tunnel barriers and method of formation" (filed Apr. 14, 2004), supra, exhibit very high tunneling magnetoresistance values of more than 160% at room temperature. However, the high tunneling magnetoresistance is derived, not only from using a method of forming the MgO tunnel barrier which does not oxidize the lower ferromagnetic electrode, but also from forming a crystalline structure in which the ferromagnetic electrodes directly above and below the (100) textured MgO tunnel barrier have a bcc crystalline structure and are also textured in the (100) orientation. The layer 115 is preferably formed from a bcc alloy formed from one or more of Co and Fe. For example, layer 118 may be formed from Fe or $Co_{84}Fe_{16}$ and layer 119 may be formed from $Co_{70}Fe_{30}$. The crystallographic texture of these layers can be controlled by suitable choice of the underlayers. For example layer 112 may be formed from a bi-layer of TaN and Ta or from a layer of Ta alone. Layer 116 may be formed from an fcc antiferromagnetic alloy of Ir and Mn where the composition of Ir is less than ~30 atomic percent. The IrMn layer grows highly oriented in the orientation when deposited on the layer 112 formed from Ta or TaN/Ta. The substrate 111 may be comprised of an amorphous material such as $SiO_2$. Using this combination of underlayers, the layer 115, comprised of one or more bcc Co—Fe alloys, is textured in the (100) orientation and the MTJ 200 displays high TMR.

A method of forming $Mg_{1-x}Zn_xO$ tunnel barriers is now described in connection with FIGS. 2A and 2B; $Mg_{1-x}Zn_xO$ tunnel barriers may be used instead of MgO tunnel barriers in the structures disclosed herein to form alternative embodiments. (See also U.S. application Ser. No. 10/734,425 to Parkin titled "Mg—Zn oxide tunnel barriers and method of formation" filed Dec. 12, 2003, which is hereby incorporated by reference.) The $Mg_{1-x}Zn_xO$ tunnel barriers are formed by i) first depositing, for example, a Mg—Zn layer without any oxygen (so that this Mg—Zn layer covers the underlying ferromagnetic or ferrimagnetic layer), and then by ii) depositing, for example, a layer of Mg—Zn in the presence of reactive oxygen during which process the previously deposited first Mg—Zn layer is oxidized, thereby forming the tunnel barrier.

The Mg—Zn composition of the metal layer 122 does not need to be the same as the Mg—Zn composition of the oxide layer 124. Indeed the layer 122 can be formed from pure Mg and the layer 124 can be formed from pure ZnO. Alternatively, the layer 122 can be formed from pure Mg and the layer 124 from $[Mg_{1-x}Zn_x]O$. Alternatively, the layer 122 can be formed from an alloy with a composition $[Mg_{1-y}Zn_y]$, whereas the layer 124 can be formed by the deposition of a layer of composition $[Mg_{1-z}Zn_z]$ in the presence of reactive oxygen. In general, to form a Mg—Zn oxide tunnel barrier according to preferred implementations of the invention herein, it is only necessary that one of the layers 122 and 124 include Mg and that the other of these layers include Zn.

The Zn concentration in the layer 122 can be higher or lower than that of the layer 124. The concentration of Zn in the layer 122 is preferably chosen to optimize the growth of the Mg—ZnO tunneling barrier 120' as well as for the target RA value. More Zn will lead to an oxide barrier with a reduced tunnel barrier height and so lower RA. Similarly, increasing the concentration of Zn in the oxide layer 124 will also lead to lower tunneling barrier heights and so to lower RA values. For the optimal tunnel barrier with the highest thermal stability, it may be preferable to form the layer 122 from an alloy of Mg—Zn with less Zn or even from pure Mg. It may also be preferable to form a tunnel barrier by first depositing a layer of Mg or a Mg—Zn alloy with small amounts of Zn, then by secondly depositing a layer of $[Mg_{1-x}Zn_x]$ in the presence of reactive oxygen (in which this layer contains a higher concentration of Zn), then by thirdly depositing a layer of Mg or [$Mg_{1-x}Zn_x$] with lower concentrations of Zn in the presence of reactive oxygen. (In this case, Mg—Zn oxide tunnel barriers of two or more layers may be formed. These layers may be of the form [$Zn_{1-x}Mg_x$]O, in which the Mg atomic percentage is between 1 and 100, or between 1 and 99.) In general it may be advantageous to form the tunnel barrier 120' from a first layer of Zn or Mg or Mg—Zn, and then by depositing a sequence of Zn or Mg or Mg—Zn additional layers, in which each of the additional layers is formed in the presence of reactive oxygen. The amount of reactive oxygen may be varied from layer to layer. For example, it may be advantageous to have more oxygen for higher concentrations of Zn. It may also be preferable to have less reactive oxygen in the last additional layer onto which the ferromagnetic electrode 134 is subsequently deposited. The Mg—ZnO tunnel barrier 120' so formed may advantageously have a thickness of between 3 and 50 angstroms.

High tunneling magnetoresistance values have been found for a wide composition range of the ternary [$Mg_{1-x}Zn_x$]O oxides, although the values are not typically as high as those found for oxides without any zinc. Typically, just as for MgO tunnel barriers, the TMR values were increased for thermal annealing at moderate temperatures, although the thermal stability was reduced compared to that of zinc-free MgO tunnel barriers. The thermal stability is very sensitive to the oxidation state of the [$Mg_{1-x}Zn_x$]O layer, so that the properties of the MTJs are strongly dependent on the reactive sputtering conditions under which these oxide layers are formed, especially to the ratio of argon and oxygen in the sputter gas mixture.

Figure 2C:
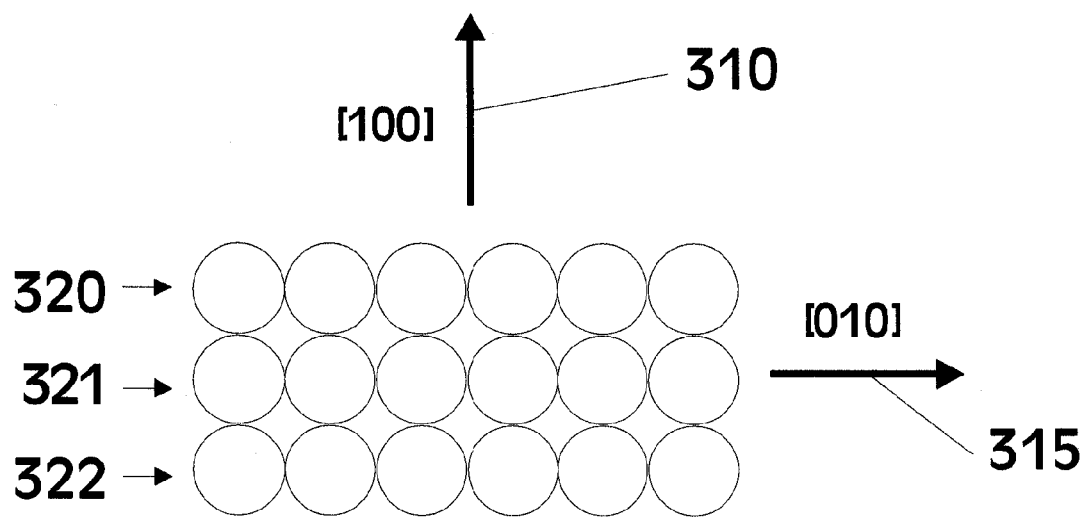
FIG. 2C is a schematic cross-section of the arrangement of the atoms in one of the layers of the textured magnetic tunnel junction formed according to the methodology of FIG. 2A.

The preferred embodiments and implementations of the invention are directed to certain magnetic layers and MgO or Mg—ZnO tunnel barrier layers which are substantially (100) oriented or textured. This is shown schematically in FIG. 2C, which shows the arrangement of atoms in a bcc structure oriented in the (100) direction with respect to the direction of tunneling of electrons. Layers 320, 321, 322 of atoms within an individual grain are shown for rows of atoms oriented along the [010] direction in-plane (indicated by the arrow 315) and (100) direction perpendicular to the plane (indicated by the arrow 310).

The pending applications to Parkin referenced above describe MTJs with high tunneling magnetoresistance using MgO tunnel barriers which use bcc CoFe or Fe electrodes; the use of amorphous ferromagnetic electrodes is described U.S. patent application Ser. No. 10/884,831 to Parkin titled "High performance magnetic tunnel barriers with amorphous materials" filed Jul. 2, 2004, which is hereby incorporated by reference. As described above, however, it may also be useful to use ferromagnetic or ferrimagnetic materials which are neither bcc nor amorphous.

Figure 3A:
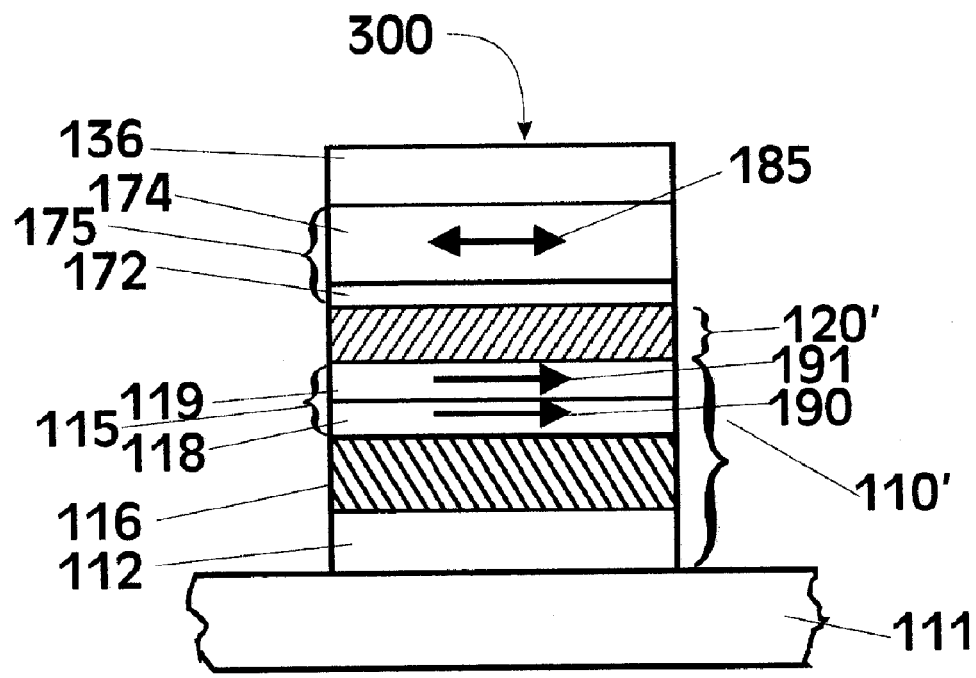
FIGS. 3A and 3B are cross-sectional views of magnetic tunnel junctions of the present invention.

FIG. 3A shows an MTJ device of the current invention that has high tunneling magnetoresistance, with a ferromagnetic electrode comprising Co being adjacent to a MgO or Mg—Zn oxide tunnel barrier. Cobalt has a much lower magnetic moment than Fe and Co—Fe alloys, and its use is therefore advantageous in ferromagnetic electrodes of an MTJ structure for reducing the demagnetizing fields associated with these ferromagnetic layers. However, when deposited as a thin film, cobalt usually takes up a crystalline structure which is either hexagonal close packed (hcp) of face centered cubic (fcc). In the current invention, however, cobalt takes up a body centered cubic (bcc) structure when it is formed on a template layer of a bcc layer of CoFe, thereby giving high tunneling magnetoresistance in conjunction with MgO and MgZnO tunnel barriers.

Preferred structures and methods of forming them are now described. The structures in the preferred embodiment are formed by magnetron sputtering using an argon sputter gas at a pressure of 3 mTorr unless otherwise stated. All the layers are formed at ambient temperature. The MTJ device shown in FIG. 3A has an exchange biased reference electrode 110' formed beneath the MgO tunnel barrier. The magnetic state of the reference electrode remains unchanged during the operation of the device. An antiferromagnetic layer 116 is used to set the direction of the moment of the ferromagnetic layer 115 by exchange bias. The direction of the exchange bias field is set either during the fabrication of the MTJ device or by heating the device above the blocking temperature of the antiferromagnetic layer and cooling the device in the presence of a magnetic field that is sufficiently large to align the moment of the layer 115 along a given direction. Although use of the antiferromagnetic layer 116 is preferred, the device may be built without it. The direction of the reference electrode 115 is then maintained during the operation of the device by providing a uniaxial anisotropy field. This may be provided by the intrinsic magnetocrystalline anisotropy of the layer 115, or it may be provided by the shape anisotropy of the reference electrode or by other means.

In FIG. 3A the direction of the magnetization of a storage layer 175, located above the tunnel barrier 120', is maintained either parallel or antiparallel to that of the layer 115 (on the other side of the tunnel barrier) during the operation of the device. The MTJ device of FIG. 3A may also be inverted, such that the reference ferromagnetic electrode is formed above the tunnel barrier and the storage layer is formed beneath the tunnel barrier.

In FIG. 3A, the substrate 111 is formed from an amorphous layer of $SiO_2$ formed on a silicon substrate. The underlayer or bottom electrical lead 112 is comprised of 200 Å TaN followed by 75 Å Ta. The TaN layer is formed by reactive sputtering of Ta in an Ar—$N_2$ mixture containing 6% $N_2$. An antiferromagnetic layer 116 of 250 Å thick IrMn is deposited on the TaN layer by ion beam sputter deposition using a beam of energetic krypton ions from an rf plasma ion source. The sputtering target used to form the IrMn layer has a composition of $Ir_{22}Mn_{78}$. Next, a ferromagnetic layer 118 of 35 Å thick $Co_{70}Fe_{30}$ is sputter deposited followed by a layer 119 of Cobalt. The moments of the layers 118 and 119 are parallel to one another because these layers are strongly ferromagnetically exchange coupled; thus they act as a single ferromagnetic layer 115. The directions of the magnetic moments of the layers 118 and 119 are shown as the arrows 190 and 191, respectively in FIG. 3A.

An MgO tunnel barrier 120' is then formed on top of the lower ferromagnetic electrode 110' using the method described in U.S. patent application Ser. No. 10/824,835 to Parkin titled "MgO tunnel barriers and method of formation" (filed Apr. 14, 2004), supra, by first depositing a thin layer of Mg having a thickness in the range of 3 to 20 Å, followed in a second step by the deposition of a layer of Mg in the presence of reactive oxygen. The thickness of the second layer, which is comprised of MgO, is typically in the range from 2 to 30 Å depending on the desired resistance-area product, which can range up to more than $10^9$ Ω $(\mu m)^2$. For the device of FIG. 3A, a Mg layer 8 Å thick was used, followed by an MgO layer 28 Å thick formed by reactive magnetron sputtering using an argon-oxygen plasma containing 3 atomic percent oxygen. During the deposition of the MgO layer, the Mg underlayer becomes oxidized so that the two layers form a single MgO tunnel barrier. The exact composition of the MgO layer may differ slightly from the stochiometric composition but Rutherford backscattering data on companion films of MgO, 500 Å thick, show that, within experimental error, the MgO layer contains 50 atomic percent O and 50 atomic percent Mg.

Next, the MTJ device shown in FIG. 3A is completed by forming the top ferromagnetic electrode 175 which is the storage layer. In FIG. 3A the storage layer is comprised of two ferromagnetic layers 172 and 174. First a thin layer 172 of 20 Å $Co_{70}Fe_{30}$ is deposited on the MgO tunnel barrier 120'. Second, an amorphous ferromagnetic layer 174 is formed which is here comprised of 100 Å thick $(Co_{70}Fe_{30})_{85}B_{15}$. This layer is formed by magnetron sputtering in a pure argon plasma where a target of composition $(CO_{70}Fe_{30})_{80}B_{20}$ is used. The composition of the film and that of the target may be significantly different, especially when the target is comprised of elements which are significantly different in atomic mass or which have significantly different sputter yields. The composition of the film was checked with Rutherford back scattering (RBS) on companion films made in the same deposition sequence which were ~1000 Å thick.

Finally, the device 300 of FIG. 3A is completed by forming a capping layer 136 which is comprised of 100 Å TaN followed by 75 Å Ru. The TaN layer is formed by reactive magnetron sputtering using an argon-nitrogen plasma containing about 8% nitrogen. The Ru layer is formed by ion beam sputtering. The amount of nitrogen in the sputter gas mixture may be different for the growth of the capping layer 136 and the underlayer 112 in order to optimize the thermal stability of the structure and the crystallographic texture of the MgO barrier for the highest tunneling magnetoresistance values.

Figure 4:
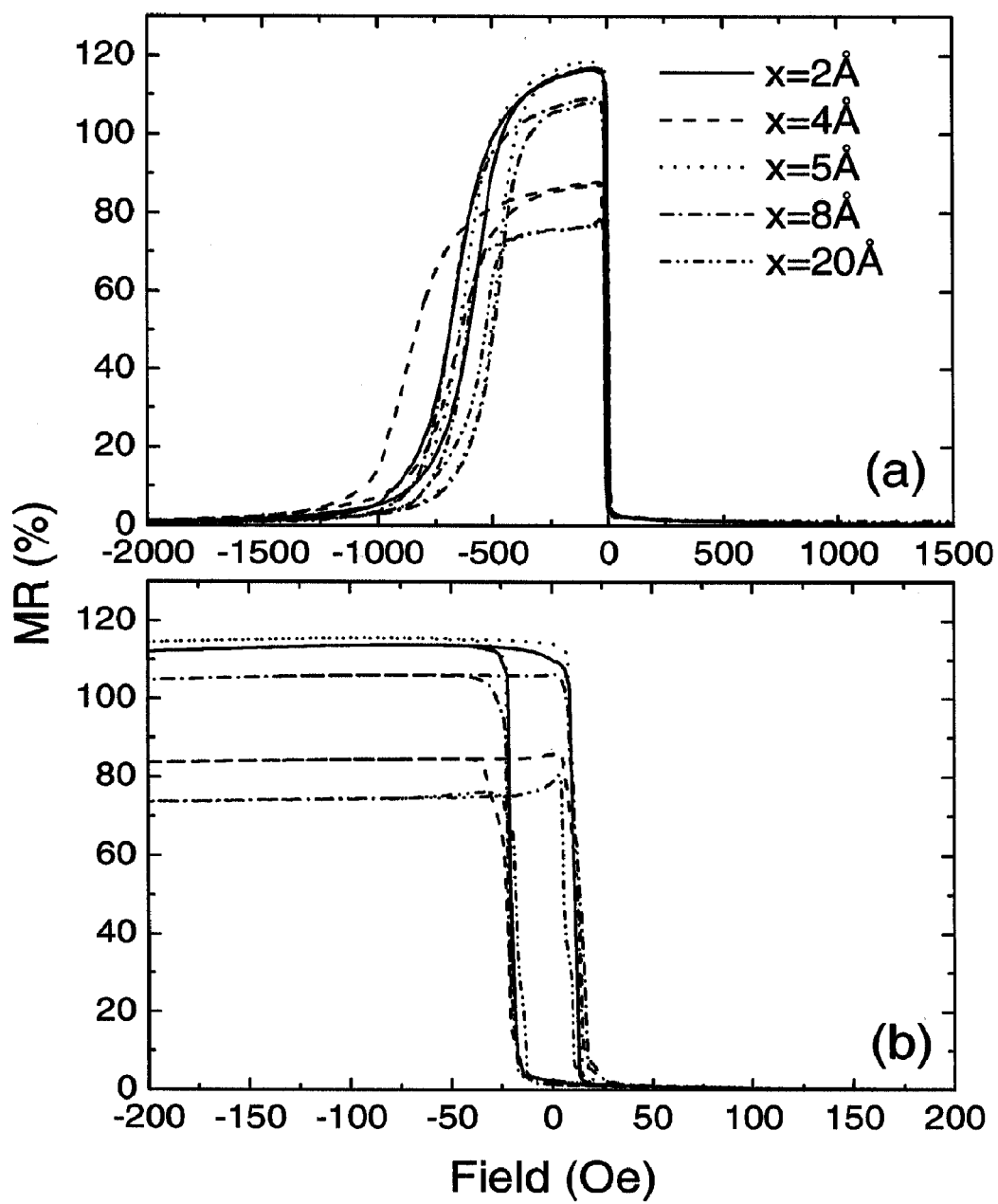
FIG. 4, which includes

Resistance versus field curves for the completed device of FIG. 3A are shown in FIG. 4. Several curves are shown corresponding to various devices prepared with different thicknesses (from 2 to 20 Å) of the cobalt layer 119. FIG. 4A shows resistance versus field curves over a range of field (applied in the plane of the sample) sufficiently large that the magnetic moments of both the storage layer 175 and the reference layer 115 can be reversed completely from a direction along the positive field direction to a direction along the negative field direction. In FIG. 4B are shown corresponding resistance versus field curves where the field range is limited so that it is sufficiently large only to reverse completely the magnetization of the storage layer. In both sets of curves shown in FIG. 4 the resistance of the device of FIG. 3A is low when the moments of the storage and reference layers are parallel to one another and is high when the moments of these layers are antiparallel to one another. As discussed in the background, the tunneling magnetoresistance is defined as the difference between the high and low resistance states divided by the resistance of the low resistance state.

Figure 3B:
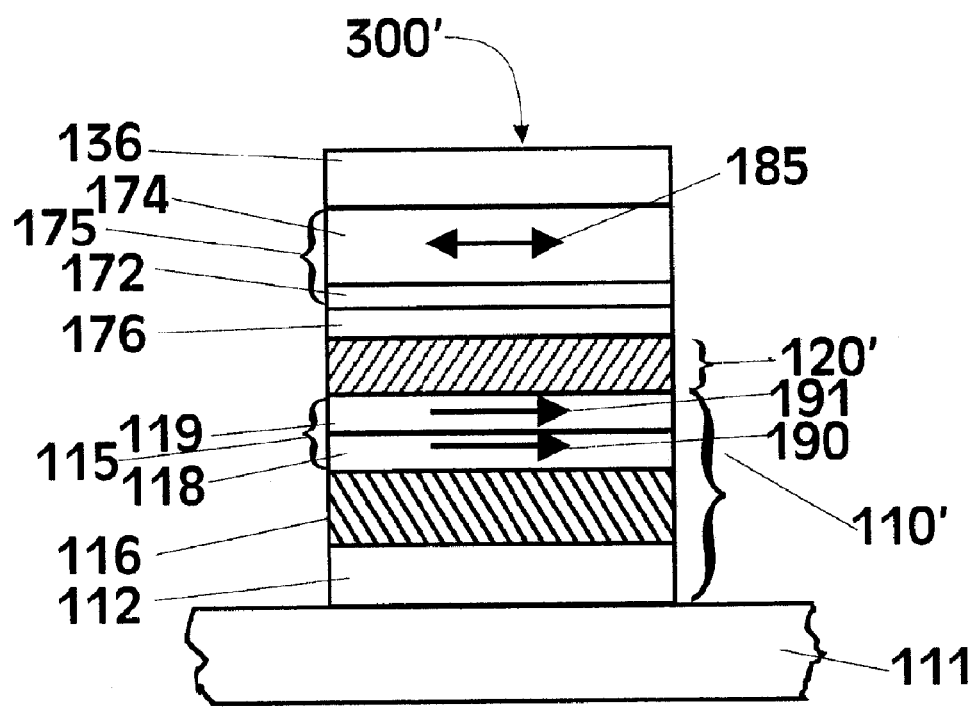

The Co layer can also be formed by deposition on top of the MgO tunnel barrier 120' as shown by the device 300' in FIG. 3B. The structure of the device of FIG. 3B is otherwise the same as that of FIG. 3A except that the reference layer 115 may be comprised of a single layer of 35 Å $Co_{70}Fe_{30}$ without any Co interface layer 119, and a thin Co layer 176 is grown on top of the MgO tunnel barrier 120' before the growth of the thin 20 Å $Co_{70}Fe_{30}$ 172. The dependence of TMR on the thickness of the Co layer 176 is very similar to that for the Co layer 119 of FIG. 3A. These data demonstrate that bcc Co layers can be stabilized above the (100) MgO tunnel barrier by templating the Co on the MgO layer. The bcc Co structure may also be further stabilized by the bcc CoFe layer 172 grown on top of it. However, the layer 172 may not be necessary to form bcc structures.

Figure 5:
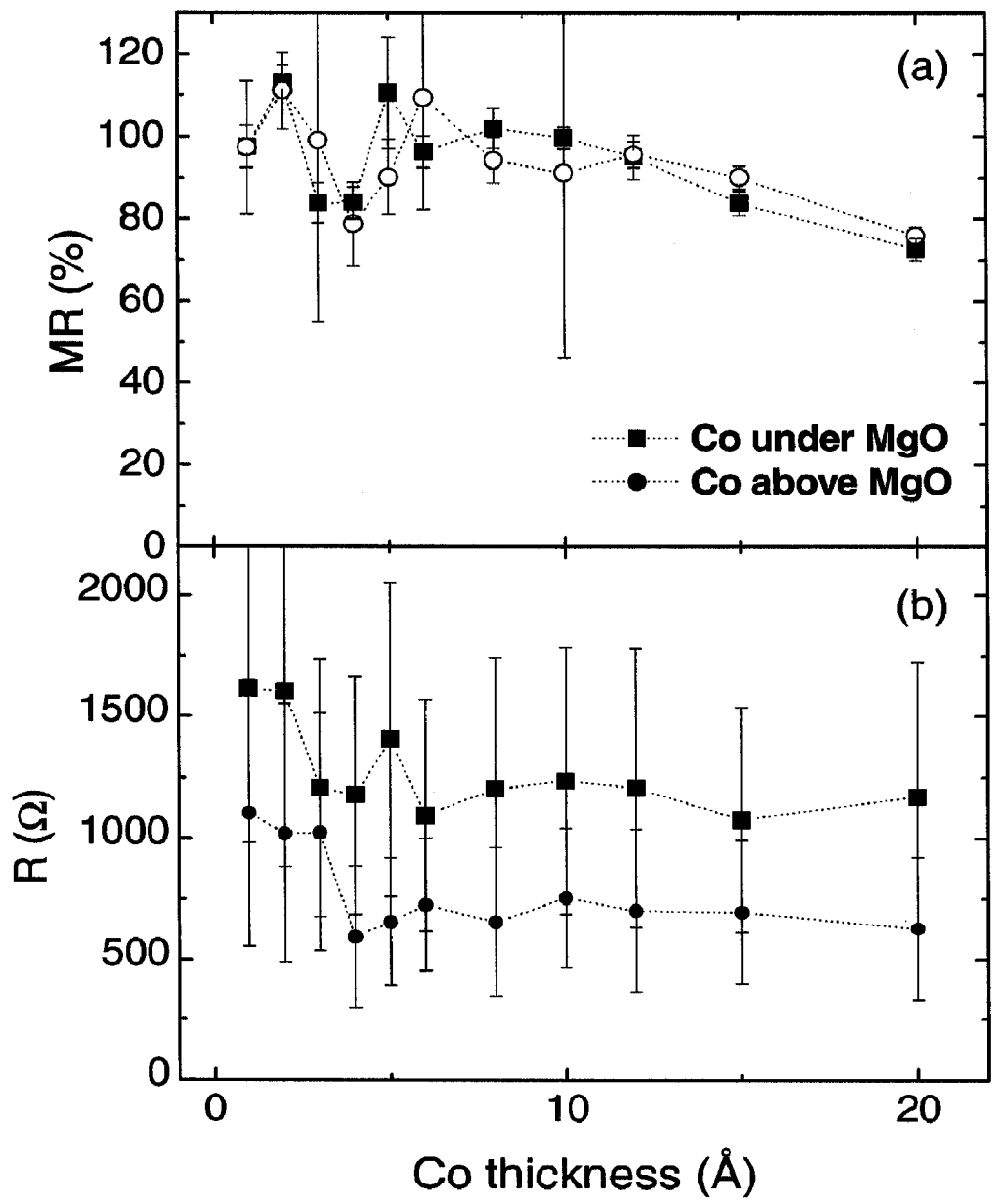
FIG. 5, which includes

FIG. 5 shows the dependence of the tunneling magnetoresistance on the thickness of the cobalt layers 176 ("above MgO") and 119 ("under MgO") for films annealed in a 1 T magnetic field in a high vacuum anneal furnace at 260 C for 90 minutes. The TMR has an oscillatory variation on Co thickness for very thin Co, but for Co thicknesses greater than about 5 Å, the TMR has values comparable to that without any Co interface layer. When the Co thickness is further increased, the TMR decreases gradually but remains higher than the very best TMR values reported for alumina tunnel barriers for Co layer thicknesses up to ~20 Å. Detailed electronic and x-ray characterization of the structure of Co layers in similarly formed structures suggests that the Co takes up a bcc structure when it is thinner than about 10 Å but gradually reverts to a non-bcc structure (most likely hcp) when this layer is further increased in thickness. (Accordingly, layers thinner than about 15 Å may be advantageous.) Thus these results demonstrate that non-bcc ferromagnetic layers can be used in MTJs with MgO tunnel barriers to give high TMR, when their structure is stabilized in the bcc phase by forming them on bcc underlayers.

Although here the bcc underlayer is a ferromagnetic layer of CoFe this layer can be formed from a non-ferromagnetic metal such as the bcc metals V, Cr, Nb, Mo and W or various alloys formed from two or more of these elements. Similarly, the underlayer could be formed from alloys of one or more of these bcc elements with Fe or Co so that the alloy is bcc. The alloys with Fe or Co can be ferromagnetic or non-ferromagnetic depending on the relative proportions of Fe and Co and the other non-magnetic constituents. The use of bcc Co layers formed on non-magnetic bcc underlayers is most useful for inverted exchange-biased structures in which the reference layer is formed on top of the MgO tunnel barrier and the storage or sensing layer is formed under the MgO tunnel barrier.

The resistance of the devices corresponding to FIG. 3A are high (resistance-area product, RA~10 MΩ $(\mu m)^2$) because the devices are formed by shadow masking and have large areas of ~80×80 $(\mu m)^2$. These devices have correspondingly thick MgO tunnel barriers. When the MgO barrier is reduced in thickness, the RA values can be substantially reduced to values as low as ~1-10 Ω $(\mu m)^2$. The corresponding TMR values are typically increased when the RA is decreased from ~10 MΩ $(\mu m)^2$ to RA values in the range of 100 to 10,000 Ω $(\mu m)^2$, because the probability of indirect tunneling via defect states in the MgO tunnel barrier is reduced when the barrier is thinner, so that direct quantum mechanical tunneling dominates for this intermediate range of MgO thickness. When the barrier is made too thin, then the probability of tunneling through weak spots in the barrier is increased and the TMR is reduced.

The TMR of the device of FIG. 3A is nearly two times higher than the highest TMR reported in prior art devices using conventional alumina tunnel barriers. Moreover, the TMR of the device 300 is very similar to devices formed using storage layers comprised of crystalline CoFe alloys as described in U.S. patent application Ser. No. 10/824,835 to Parkin titled "MgO tunnel barriers and method of formation" (filed Apr. 14, 2004) and Ser. No. 10/646,246 to Parkin titled "MgO tunnel barriers and method of formation" (filed Aug. 22, 2003), which are hereby incorporated by reference.

FIG. 3A shows a device 300 in which a thin interface layer 172 comprised of a crystalline CoFe alloy is first formed on the MgO tunnel barrier prior to the deposition of the amorphous ferromagnetic layer 174. Thus the storage layer is formed from a bilayer of two ferromagnetic layers, a first crystalline ferromagnetic layer 172 and a second amorphous ferromagnetic layer 174. These layers may also be formed from ferrimagnetic layers, crystalline and amorphous in nature, respectively. In FIG. 3A the layer 172 is formed from 20 Å thick $Co_{70}Fe_{30}$, which may be deposited by magnetron or ion beam sputter deposition. The thickness of the CoFe interface layer 172 ranges preferably from 2.5 to 30 Å. The thickness of this layer is preferably kept as small as possible so that the magnetic properties of the storage layer 175 are dominated by that of the amorphous layer 174. The storage layer can also be formed without the CoFe interface layer 172.

Although the use of non-bcc ferromagnetic metals has been described with respect to thin Co layers formed adjacent to a MgO tunnel barrier, bcc Co layers can also be used at a distance from the MgO tunnel barrier provided that the bcc phase of Co is stabilized by making the Co layer thin enough and by placing the Co layer in proximity to suitable bcc layers, whether ferromagnetic or non-ferromagnetic. For example, layers of bcc Co could be incorporated in synthetic antiferromagnetic layers in either the reference or storage layers. The bcc structure of Co can be stabilized in these layers by templating it with the ferromagnetic layers or with the non-ferromagnetic antiferromagnetic coupling layer where this layer is, for example, comprised of a Cr or a Cr—Mo alloy as described in U.S. patent application Ser. No. 10/884,696 to Parkin entitled "Magnetic tunnel barriers and associated magnetic tunnel junctions with high tunneling magnetoresistance", filed Jul. 2, 2004, which is hereby incorporated by reference, (and which was published as US Patent Application Publication 20060012926 with the erroneous Application Ser. No. of 10/891,363).

Although examples of the various embodiments of the current invention have been principally described with regard to the use of MgO tunnel barriers, the MgO tunnel barrier may be replaced by a barrier formed from $Mg_{1-x}Zn_xO$ or from a barrier comprised of multiple layers of $Mg_{1-x}Zn_xO$, where x is varied from layer to layer or may be formed from one or more layers of MgO and $Mg_{1-x}Zn_xO$. (See U.S. application Ser. No. 10/734,425 to Parkin titled "Mg—Zn oxide tunnel barriers and method of formation" filed Dec. 12, 2003.)

Similarly, the use of non-bcc ferromagnetic materials in combination with MgO or MgZnO tunnel barriers is not limited to magnetic tunnel junctions but may also be used to create improved tunnel spin injectors. The structure and method of formation of tunnel spin injectors for spintronic devices using MgO tunnel barriers is described in U.S. patent application Ser. No. 10/646,247 to Parkin titled "MgO-based tunnel spin injectors", filed Aug. 22, 2003, which is hereby incorporated by reference.

Similarly, the MgO tunnel barrier could be replaced by one of the family of simple cubic or zinc blende tunnel barriers including ZnS, ZnSe and ZnTe, CdS, CdSe and CdTe, and AlAs and related materials including insulating $Al_{1-x}Ga_xAs$. These materials will grow in a highly textured crystallographic orientation on bcc ferromagnetic metals.

While the preferred embodiments of the current invention apply to structures with (100) texturing for the highest possible TMR or spin polarization values, the structures and devices described herein may be prepared in other crystallographic orientations, and so be advantageous in other regards.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method, comprising:
   depositing magnetic material onto a bcc-structured underlayer to induce the magnetic material to form a bcc-structured magnetic layer, wherein the magnetic material by itself does not form a thermodynamically stable bcc-structure at room temperature and a pressure less than 1 atmosphere, and wherein the magnetic material includes material selected from the group consisting of ferromagnetic materials and ferrimagnetic materials; and
   forming a tunnel barrier over the deposited magnetic material to permit spin-polarized current to pass between the tunnel barrier and the magnetic material, wherein the tunnel barrier is selected from the group of tunnel barriers consisting of MgO and Mg—ZnO.

2. The method of claim 1, wherein the deposited magnetic material is at least partially (100) oriented to improve the performance of the tunnel barrier.

3. The method of claim 1, wherein the tunnel barrier is (100) oriented.

4. The method of claim 1, wherein the bcc-structured underlayer is neither ferromagnetic nor ferrimagnetic.

5. The method of claim 1, wherein the bcc-structured underlayer includes at least one of V, Cr, Nb, Mo, and W.

6. The method of claim 1, wherein the bcc-structured underlayer includes at least one of V, Cr, Nb, Mo, and W that is alloyed with at least one of Fe, Co, and Ni.

7. The method of claim 1, wherein the deposited magnetic material includes Co.

8. The method of claim 1, wherein the deposited magnetic material includes material selected from the group consisting of CoNi and NiFe alloys.

9. The method of claim 1, wherein the deposited magnetic material has a thickness of between 0.5 and 1.5 nm.

10. The method of claim 1, wherein the bcc-structured underlayer includes an alloy of at least one of Fe, Ni, and Co.

11. The method of claim 1, wherein the bcc-structured underlayer includes a CoFe alloy having an Fe content of at least 14 atomic percent.

12. The method of claim 1, wherein the bcc-structured underlayer includes a layer of non-ferromagnetic, non-ferrimagnetic material over a layer of magnetic material selected from the group consisting of ferromagnetic materials and ferrimagnetic materials.

13. The method of claim 1, wherein the tunnel barrier, the deposited magnetic material, and the bcc-structured underlayer form a magnetic tunneling device, the method further comprising annealing the device to improve its performance.

14. The method of claim 13, comprising annealing the magnetic tunneling device at a temperature of at least 220° C.

15. The method of claim 1, further comprising depositing a layer of magnetic material over the tunnel barrier to form a magnetic tunnel junction.

16. The method of claim 15, comprising annealing the magnetic tunnel junction to improve its tunneling magnetoresistance.

17. The method of claim 15, wherein the magnetic tunnel junction has a tunneling magnetoresistance of at least 80%.

18. The method of claim 15, wherein the magnetic tunnel junction has a tunneling magnetoresistance of at least 100%.

19. The method of claim 1, wherein the tunnel barrier includes a MgO tunnel barrier, and the MgO tunnel barrier is formed by:
   depositing Mg onto the deposited magnetic material to form a Mg layer thereon; and
   directing additional Mg, in the presence of oxygen, towards the Mg layer to form a MgO tunnel barrier in contact with the deposited magnetic material, the oxygen reacting with the additional Mg and the Mg layer.

20. The method of claim 1, wherein the tunnel barrier includes a Mg—ZnO tunnel barrier formed by:
   depositing a metal layer onto the deposited magnetic material; and
   directing additional metal towards the metal layer, in the presence of oxygen, to form a magnesium-zinc oxide tunnel barrier in contact with the deposited magnetic material, the oxygen reacting with the additional metal and the metal layer, wherein:
   at least one of the metal layer and the additional metal includes Zn, and
   at least one of the metal layer and the additional metal includes Mg.

21. The method of claim 1, wherein the magnetic material is selected because it has a desirable physical parameter related to at least one of the following: corrosion resistance, magnetic anisotropy, and magnetorestriction.

22. A device, comprising:
   a tunnel barrier selected from the group of tunnel barriers consisting of MgO and Mg—ZnO;
   a bcc structure; and
   a magnetic layer between the tunnel barrier and the bcc structure, wherein the magnetic layer:
   i) by itself does not form a thermodynamically stable bcc-structure at room temperature and a pressure less than 1 atmosphere,
   ii) but is nevertheless bcc-structured because of its proximity to the bcc structure,
   iii) includes material selected from the group consisting of ferromagnetic materials and ferrimagnetic materials, and
   iv) is in proximity with the tunnel barrier, thereby permitting spin-polarized current to pass between the tunnel barrier and the magnetic layer.

23. The device of claim 22, wherein the bcc structure includes:
   a layer of non-ferromagnetic, non-ferrimagnetic material in contact with the magnetic layer, and
   a layer of material selected from the group consisting of ferromagnetic and ferrimagnetic materials.

24. The device of claim 22, wherein the tunnel barrier is in contact with the magnetic layer.

25. The device of claim 22, wherein the magnetic material is at least partially (100) oriented to improve the performance of the tunnel barrier.

26. The device of claim 22, wherein the tunnel barrier is (100) oriented.

27. The device of claim 22, wherein the bcc structure is neither ferromagnetic nor ferrimagnetic.

28. The device of claim 22, wherein the bcc structure includes at least one of V, Cr, Nb, Mo, and W.

29. The device of claim 22, wherein the bcc structure includes at least one V, Cr, Nb, Mo, and W that is alloyed with at least one of Fe, Co, and Ni.

30. The device of claim 22, wherein the magnetic layer includes Co.

31. The device of claim 22, wherein the magnetic layer includes material selected from the group consisting of CoNi and NiFe alloys.

32. The device of claim 22, wherein the magnetic layer has a thickness of between 0.5 and 1.5 nm.

33. The device of claim 22, wherein the bcc structure includes an alloy of at least one of Fe, Ni, and Co.

34. The device of claim 22, wherein the bcc structure includes a CoFe alloy having an Fe content of at least 14 atomic percent.

35. The device of claim 22, wherein the bcc structure includes a layer of non-ferromagnetic, non-ferrimagnetic material in contact with a layer of magnetic material selected from the group consisting of ferromagnetic materials and ferrimagnetic materials.

36. The device of claim 22, wherein the device has been annealed to improve its performance.

37. The device of claim 22, wherein the magnetic material is selected because it has a desirable physical parameter related to at least one of the following: corrosion resistance, magnetic anisotropy, and magnetorestriction.

38. The device of claim 37, wherein the selected magnetic material includes an alloy of Co.

39. The device of claim 37, wherein the selected magnetic material includes an alloy of Fe.

40. The device of claim 37, wherein the selected magnetic material includes an alloy of Ni.

41. The device of claim 22, further comprising a second layer of magnetic material in proximity with the tunnel barrier, so that the device forms a magnetic tunnel junction.

42. The device of claim 41, wherein the magnetic tunnel junction has a tunneling magnetoresistance of at least 80%.

43. The device of claim 41, wherein the magnetic tunnel junction has a tunneling magnetoresistance of at least 100%.

44. A device, comprising:
   a bcc magnetic material selected from the group consisting of ferromagnetic materials and ferrimagnetic materials; and
   a tunnel barrier in proximity with the bcc magnetic material, permitting spin-polarized current to pass between the tunnel barrier and the magnetic layer,
   wherein the bcc magnetic material by itself does not form a thermodynamically stable bcc-structure at room temperature and a pressure less than 1 atmosphere, but is nevertheless bcc because of its proximity to a nearby material having a structure that induces the magnetic material to form a bcc-structure.

45. The device of claim 44, wherein the tunnel barrier includes a MgO tunnel barrier.

46. The device of claim 44, wherein the tunnel barrier includes a Mg—Zn oxide tunnel barrier.

47. The device of claim 44, wherein the tunnel barrier includes a tunnel barrier selected from the group of tunnel barriers consisting of ZnS, ZnSe, ZnTe, CdS, CdSe, CdTe, AlAs and $Al_{1-x}Ga_xAs$.

48. The device of claim 44, wherein the magnetic material includes Co.

49. The device of claim 44, wherein the magnetic material includes material selected from the group consisting of CoNi and NiFe alloys.

50. The device of claim 44, wherein the nearby material includes at least one of V, Cr, Nb, Mo, W, and alloys thereof.

51. The device of claim 44, wherein the nearby material includes at least one of V, Cr, Nb, Mo, and W that is alloyed with at least one of Fe and Co.

52. The device of claim 44, wherein the nearby material is MgO of a simple cubic structure.

53. The device of claim 52, wherein the simple-cubic MgO is in contact with the bcc magnetic material.

54. The device of claim 44, wherein the bcc magnetic material is at least partially (100) oriented to improve the performance of the tunnel barrier, and the tunnel barrier is (100) oriented.

55. The device of claim 44, further comprising a layer of magnetic material that together with the bcc magnetic material and the tunnel barrier forms a magnetic tunnel junction.

56. The device of claim 55, wherein the magnetic tunnel junction has a tunneling magnetoresistance of at least 80%.

57. The device of claim 55, wherein the magnetic tunnel junction has a tunneling magnetoresistance of at least 100%.

58. A method, comprising:
  positioning preselected magnetic material and a tunnel barrier in proximity with each other, to form a structure that permits spin-polarized current to pass between the tunnel barrier and bcc magnetic material, wherein the preselected magnetic material:
  i) by itself does not form a thermodynamically stable bcc-structure at room temperature and a pressure less than 1 atmosphere,
  ii) but is nevertheless bcc-structured because of its proximity to a nearby material having a structure that induces it to form said bcc magnetic material, and
  iii) includes material selected from the group consisting of ferromagnetic materials and ferrimagnetic materials.

59. The method of claim 58, wherein the nearby material is the tunnel barrier.

60. The method of claim 59, wherein the tunnel barrier includes simple cubic MgO.

61. The method of claim 58, wherein the preselected magnetic material is selected because it has a desirable physical parameter related to at least one of the following: corrosion resistance, magnetic anisotropy, and magnetorestriction.

62. The method of claim 58, wherein the preselected magnetic material includes Co.

63. The method of claim 58, wherein the preselected magnetic material includes material selected from the group consisting of CoNi and NiFe alloys.

64. The method of claim 58, wherein the nearby material includes at least one of V, Cr, Nb, Mo, and W.

65. The method of claim 58, wherein the nearby material includes at least one of V, Cr, Nb, Mo, and W that is alloyed with at least one of Fe and Co.

66. The method of claim 58, wherein the tunnel barrier includes a MgO tunnel barrier.

67. The method of claim 58, wherein the tunnel barrier includes a Mg—Zn oxide tunnel barrier.

68. The method of claim 58, wherein the tunnel barrier includes a tunnel barrier selected from the group of tunnel barriers consisting of ZnS, ZnSe, ZnTe, CdS, CdSe, CdTe, AlAs and $Al_{1-x}Ga_xAs$.

69. The method of claim 58, wherein the bcc magnetic material is at least partially (100) oriented to improve the performance of the tunnel barrier, and the tunnel barrier is (100) oriented.

70. The method of claim 58, wherein the tunnel barrier includes a MgO tunnel barrier, and the MgO tunnel barrier is formed by:
  depositing Mg onto an underlayer to form a Mg layer thereon; and
  directing additional Mg, in the presence of oxygen, towards the Mg layer to form a MgO tunnel barrier in contact with the underlayer, the oxygen reacting with the additional Mg and the Mg layer.

71. The method of claim 58, wherein the tunnel barrier includes a Mg—ZnO tunnel barrier, and the Mg—ZnO tunnel barrier is formed by:
  depositing a metal layer onto an underlayer; and
  directing additional metal towards the metal layer, in the presence of oxygen, to form a magnesium-zinc oxide tunnel barrier in contact with the underlayer, the oxygen reacting with the additional metal and the metal layer, wherein:
  at least one of the metal layer and the additional metal includes Zn, and
  at least one of the metal layer and the additional metal includes Mg.

72. The method of claim 58, further comprising forming a magnetic layer in proximity with the tunnel barrier, so that the magnetic layer, the preselected magnetic material, and the tunnel barrier form a magnetic tunnel junction.

73. The method of claim 72, comprising annealing the magnetic tunnel junction at a temperature of at least 220° C. to improve its tunneling magnetoresistance.

74. The method of claim 72, wherein the magnetic tunnel junction has a tunneling magnetoresistance of at least 80%.

75. The method of claim 72, wherein the magnetic tunnel junction has a tunneling magnetoresistance of at least 100%.

* * * * *